(12) United States Patent
Neidengard et al.

(10) Patent No.: US 9,876,491 B2
(45) Date of Patent: Jan. 23, 2018

(54) APPARATUS, SYSTEM, AND METHOD FOR RE-SYNTHESIZING A CLOCK SIGNAL

(71) Applicant: INTEL CORPORATION, Santa Clara, CA (US)

(72) Inventors: Mark Neidengard, Beaverton, OR (US); Vaughn Grossnickle, Beaverton, OR (US); Nasser Kurd, Portland, OR (US); Jeffrey Krieger, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 28 days.

(21) Appl. No.: 14/929,154

(22) Filed: Oct. 30, 2015

(65) Prior Publication Data

US 2016/0056807 A1 Feb. 25, 2016
US 2016/0344379 A9 Nov. 24, 2016

Related U.S. Application Data

(63) Continuation of application No. 13/993,137, filed as application No. PCT/US2011/065178 on Dec. 15, 2011, now Pat. No. 9,190,991.

(51) Int. Cl.
*H03K 5/156* (2006.01)
*H03K 3/03* (2006.01)

(52) U.S. Cl.
CPC ......... *H03K 5/1565* (2013.01); *H03K 3/0315* (2013.01)

(58) Field of Classification Search
CPC ........................................................ H03K 5/04
See application file for complete search history.

(56) References Cited

U.S. PATENT DOCUMENTS

| | | | |
|---|---|---|---|
| 6,426,660 B1 | 7/2002 | Ho et al. | |
| 6,906,562 B1 | 6/2005 | Nguyen | |
| 7,199,634 B2 | 4/2007 | Cho et al. | |
| 7,259,604 B2 | 8/2007 | Gomm | |
| 7,888,983 B2* | 2/2011 | Zhang | H03K 5/1565 |
| | | | 327/172 |
| 9,190,991 B2* | 11/2015 | Neidengard | G06F 1/04 |
| 2001/0052805 A1 | 12/2001 | Kim | |
| 2003/0011413 A1 | 1/2003 | Masleid | |

(Continued)

OTHER PUBLICATIONS

Int'l Search Report and Written Opinion dated Jul. 16, 2012 for Int'l Patent Application No. PCT/US2011/065178, 8 pages.

(Continued)

*Primary Examiner* — Hai L Nguyen
(74) *Attorney, Agent, or Firm* — Blakely, Sokoloff, Taylor & Zafman LLP

(57) ABSTRACT

Described herein are apparatus, method, and system for re-synthesizing a clock signal. The apparatus comprises: a first logic unit to detect a rising edge of an input clock signal and for generating a rising edge of an output clock signal based on the detected rising edge of the input clock signal, the input clock signal having a non-50% duty cycle and a first period; and a second logic unit to compute a falling edge of the output clock signal according to the detected rising edge of the input clock signal, the falling edge of the output clock signal being near half of the first period.

20 Claims, 7 Drawing Sheets

(56) References Cited

U.S. PATENT DOCUMENTS

2010/0019801 A1 1/2010 Miyazaki
2010/0327929 A1* 12/2010 Zhang .................. H03K 5/1565
327/175

OTHER PUBLICATIONS

International Preliminary Report on Patentability for International Patent Application No. PCT/US2011/065178, dated Jun. 26, 2014, 6 pages.

* cited by examiner

APPARATUS, SYSTEM, AND METHOD FOR RE-SYNTHESIZING A CLOCK SIGNAL

CLAIM OF PRIORITY

The present application is a continuation of co-pending U.S. patent application Ser. No. 13/993,137, filed Jun. 11, 2013, now U.S. Pat. No. 9,190,991; which is issued on Nov. 17, 2015, which claims the benefit of priority of International Patent Application No. PCT/US2011/065178 filed Dec. 15, 2011, titled "Apparatus, System, And Method For Re-Synthesizing A Clock Signal," which is incorporated by reference in its entirety.

FIELD OF THE INVENTION

Embodiments of the invention relate generally to the field of processors. More particularly, embodiments of the invention relate to an apparatus, system, and method for re-synthesizing a clock signal.

BACKGROUND

Duty cycle recreation based on an input clock signal can be achieved by a center-tapped delay line which is delay-locked to the period of the input clock signal. However, for input clock signals with long periods, for example 40 nanoseconds, a very long delay line is needed to accommodate the long period. This very long delay line directly translates to higher power dissipation and larger silicon area.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

SUMMARY

Figure 1:
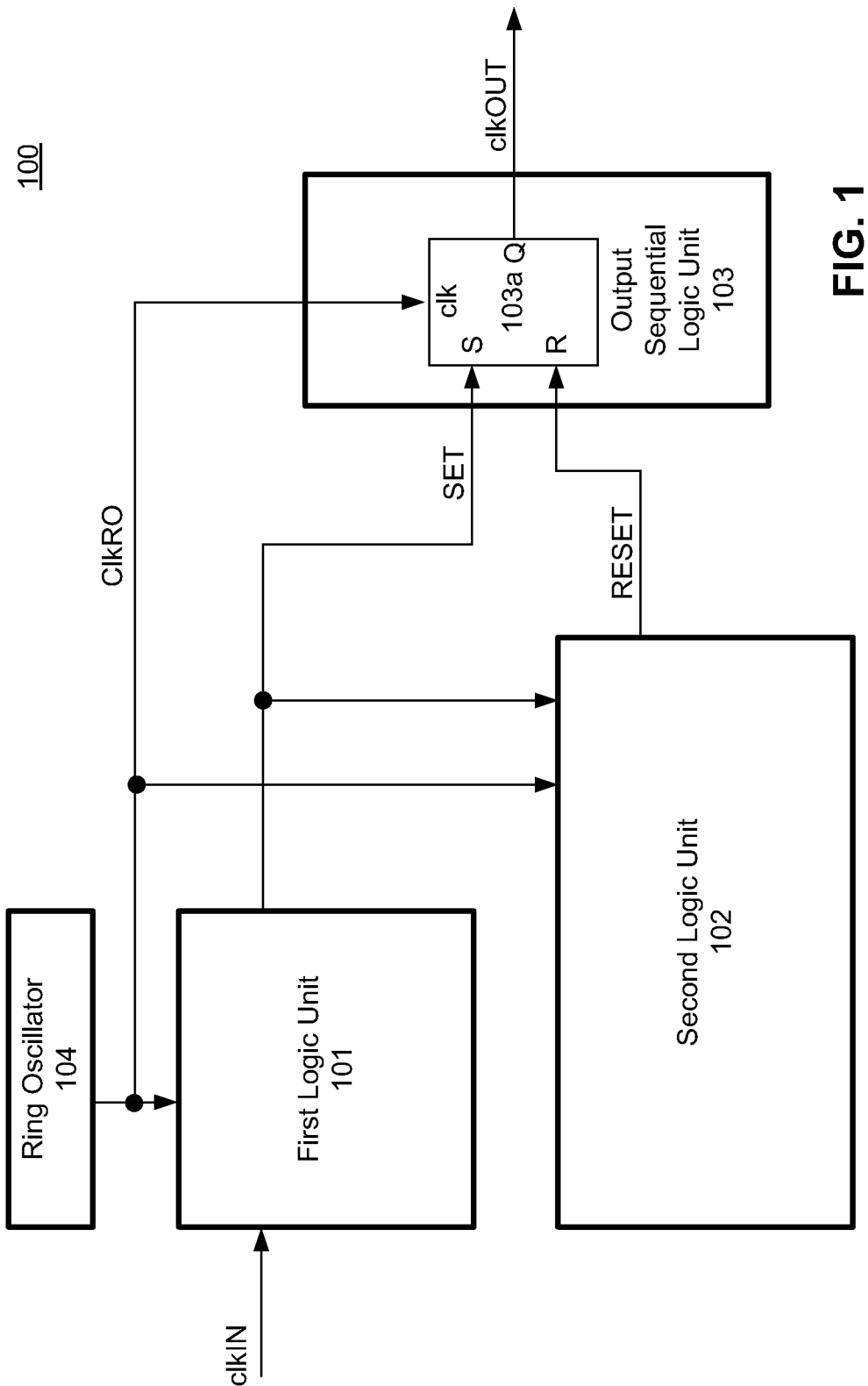
FIG. 1 is a block diagram of a clock re-synthesizer, according to one embodiment of the invention.

The following presents a simplified summary of the embodiments of the invention in order to provide a basic understanding of some aspects of the embodiments. This summary is not an extensive overview of the embodiments of the invention. It is intended to neither identify key or critical elements of the embodiments nor delineate the scope of the embodiments. Its sole purpose is to present some concepts of the embodiments of the invention in a simplified form as a prelude to the more detailed description that is presented later.

Embodiments of the invention relate to an apparatus, method, and system for re-synthesizing a clock signal.

In one embodiment, the apparatus comprises: a first logic unit to detect a rising edge of an input clock signal and for generating a rising edge of an output clock signal based on the detected rising edge of the input clock signal, the input clock signal having a non-50% duty cycle and a first period; and a second logic unit to compute a falling edge of the output clock signal according to the detected rising edge of the input clock signal, the falling edge of the output clock signal being near half of the first period.

In one embodiment, the method comprises: detecting a rising edge of an input clock signal, the input clock signal having a non-50% duty cycle and a first period; generating a rising edge of an output clock signal according to the detected rising edge of the input clock signal; and computing a falling edge of the output clock signal according to the detected rising edge of the input clock signal, the falling edge being near half of the first period.

In one embodiment, the system comprises a display unit and/or a wireless connectivity; and a clock re-synthesizer, coupled to the display unit or coupled to the wireless connectivity, the clock re-synthesizer including: a first logic unit to detect a rising edge of an input clock signal and for generating a rising edge of an output clock signal based on the detected rising edge of the input clock signal, the input clock signal having a non-50% duty cycle and a first period; and a second logic unit to compute a falling edge of the output clock signal according to the detected rising edge of the input clock signal, the falling edge of the output clock signal being near half of the first period.

The following description and the annexed drawings set forth in detail certain illustrative aspects of the embodiments of the invention. These aspects are indicative, however, of but a few of the various ways in which the principles of the embodiments of the invention may be employed. The embodiments of the invention are intended to embrace all equivalents in the form of alternatives, modifications, and variations that fall within the broad scope of the appended claims. Other advantages and novel features of the embodiments of the invention will become apparent from the following detailed description of the embodiments of the invention when considered in conjunction with the drawings.

DETAILED DESCRIPTION

Embodiments of the invention relate to an apparatus, system, and method for a re-synthesizing a clock signal. In one embodiment, a ring oscillator (which is a short delay line in a feedback loop) is used with a cyclic counter to effectively shorten the length of a delay line which would otherwise be a long delay line, to provide a center-tap for an input clock signal with a long period, for example 40 nanoseconds or near 24 MHz frequency. The input clock signal in the embodiments discussed herein has a non-50% duty cycle.

The term "non-50%" duty cycle herein refers to a duty cycle of a periodic signal which is at least 20% or more different (larger or smaller) than a perfect 50% duty cycle signal. However, a person skilled in the art would appreciate that the embodiments discussed herein are not restricted to a non-50% duty cycle of a periodic signal which is at least 20% or more different (larger or smaller) than a perfect 50% duty cycle signal, but can function with a non-50% duty cycle which is arbitrarily close (within 10%) to 0% duty cycle, or equivalently close (within 10%) to 100% duty cycle, so long as there is a pulse wide enough to register with the logic that receives it.

In one embodiment, a logic unit detects a rising edge of the input clock signal and generates a SET signal to set a sequential logic unit in response to the detecting. The SET signal causes the sequential logic unit to set itself to a predetermined voltage output level which corresponds to a rising edge of the output clock signal. In one embodiment, the falling edge of the output clock signal is generated by identifying the halfway mark of the period of the input clock signal.

For example, a counter is used to count to the halfway mark of the period of the input clock signal. In one embodiment, a RESET signal is generated when the count value of the counter reaches the halfway mark of the period of the input clock signal. In such an embodiment, the RESET signal is used to reset the sequential logic unit to a predetermined voltage output level, which is logically different from the predetermined voltage output level generated by the SET signal. For example, the SET signal causes a rising edge transition in the output clock signal while the RESET signal causes a falling edge transition in the output clock signal. In the embodiments discussed herein the output clock signal has a near 50% duty cycle and reduced jitter than the input clock signal.

The term "near 50%" herein refers to a value which is within 20% of the perfect 50% mark. For example, a 42-58%, i.e. 50%+/−8%, duty cycle is considered a near 50% duty cycle.

The technical effect of the embodiments discussed herein is the re-synthesis of a very slow input clock signal (e.g., 24 MHz) with a non-50% duty cycle to a near 50% duty cycle output clock signal with reduced jitter. The embodiments herein do not use a conventional DLL—with a variable delay line having a phase detector actuated by a phase driven loop control—to re-synthesize a very slow input clock cycle. The embodiments herein use a divided down (by K) period of a ring oscillator output, in conjunction with the rest of state machine, to produce an unconventional DLL—without a variable delay line and without a phase detector actuated by a phase driven loop control—to re-synthesize a very slow input clock cycle. The benefit of this unconventional DLL is that a single delay line long enough to match the input clock period is no longer needed. The unconventional DLL described herein consumes less power compared to circuit architectures that use conventional DLLs to re-synthesize a very slow input clock cycle. The embodiments herein use a counter with a counter range, times the period of the ring oscillator, to be at least equal to the input clock period. The technical effect of the embodiments results in a log 2arithmically less space and leakage power than a clock re-synthesizer using a conventional DLL.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

FIG. 1 is a block diagram of a clock re-synthesizer 100, according to one embodiment of the invention. In one embodiment, the clock re-synthesizer 100 comprises a first logic unit 101 which is operable to receive the input clock signal clkIN which has a non-50% duty cycle, and to generate a SET signal to set an output sequential logic unit 103. In one embodiment, the first logic unit 101 is operable to detect a rising edge of the input clock signal clkIN and then use that detected rising edge to generate the SET signal. The SET signal is then used to set the output sequential logic unit 103 to a predetermined voltage output level which corresponds to a rising edge of the output clock signal clkOUT.

In one embodiment, the clock re-synthesizer 100 comprises a second logic unit 102 which is used to count to the halfway mark of the period of the input clock signal. In one embodiment, a RESET signal is generated when the count value of the counter of the second logic unit 102 reaches the halfway mark of the period of the input clock signal. In such an embodiment, the RESET signal is used to reset the output sequential logic unit 103 to a predetermined voltage output level, which is logically different from the predetermined voltage output level generated by the SET signal. For example, the SET signal causes a rising edge transition in the output clock signal clkOUT while the RESET signal causes a falling edge transition in the output clock signal clkOUT.

In one embodiment, the clock re-synthesizer 100 comprises a ring oscillator 104 to provide a sampling clock signal ClkRO to the first 101 and second 102 logic units and the output sequential logic unit 103. The ring oscillator 104 is a delay line configured in a feedback loop so that it generates a periodic signal ClkRO. In one embodiment, the ring oscillator 104 comprises a chain of inverters where the last inverter in the chain provides input to the first inverter of the chain. The speed of the ring oscillator 104 determines the accuracy of the duty cycle. For example, as the frequency of ClkRO increases, the duty cycle of the output clock signal clkOUT is closer to being a 50% duty cycle.

In one embodiment, the output sequential logic unit 103 comprises a flip-flop 103a which is operable to be set asynchronously by the SET signal. In other embodiments, the flip-flop 103a is operable to be set synchronously with respect to ClkRO by the SET signal. In one embodiment, the 103a is operable to be reset asynchronously by the RESET signal. In other embodiments, the flip-flop 103a is operable to be reset synchronously with respect to ClkRO by the RESET signal. While the embodiments herein describe all sequential logic units as flip-flops, other forms of sequential logic units may be used without changing the essence of the embodiments of the invention.

Figure 2:
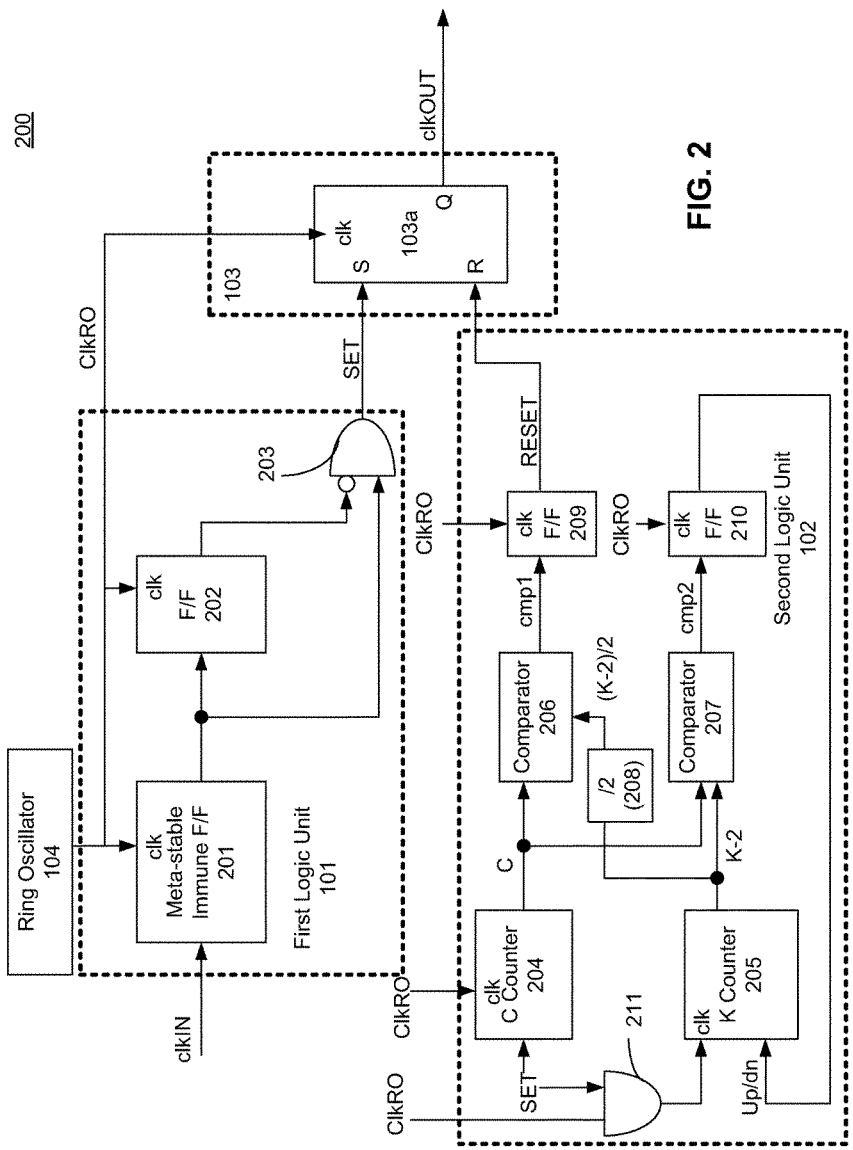
FIG. 2 is a logical block diagram of the clock re-synthesizer, according to one embodiment of the invention.

FIG. 2 is a logical block diagram 200 of the clock re-synthesizer 100, according to one embodiment of the invention. The logical block diagram 200 provides implementation details of how the SET and RESET signals are generated, according to one embodiment of the invention. In one embodiment, the first logic unit 101 comprises an edge detector which includes a flip-flop 202 and a compare logic unit 203 to compare the input signal clkIN and the output of the flip-flop 202 to generate the SET signal. In one embodiment, the compare logic unit 203 performs a logical AND operation between the clkIN signal and an inverted version of the output of the flip-flop 202. The compare logic unit 203 may be implemented as a NAND logical gate or a NOR gate, according to one embodiment of the invention.

In one embodiment, the edge detector further comprises a meta-stable resistant flip-flop 201 which provides a stable input clock signal to the flip-flop 202 and the compare logic unit 203. In such an embodiment, the meta-stable resistant flip-flop 201 receives the input clock signal clkIN and provides a deterministic meta-stable resistant clock signal to the flip-flop 202 and the compare logic unit 203. In the embodiments discussed herein, the meta-stable resistant flip-flop 201 and the flip-flop 202 are synchronous flip-flops that apply the output ClkRO of the ring oscillator 104 as the sampling clock signal.

In one embodiment, the SET signal which is generated by the compare logic unit 203 of the edge detector of the first logic unit 101 is used to set the output sequential logic unit 103. In such an embodiment, the first logic unit 101 detects a rising edge of the input clock signal clkIN and then uses that detected rising edge to generate the SET signal. The SET signal is then used to set the output sequential logic unit 103 to a predetermined voltage output level which corresponds to a rising edge of the output clock signal clkOUT.

In one embodiment, the second logic unit comprises a first counter 204 (also called the C-counter) to begin counting when the SET signal is generated by the first logic unit 101. In this embodiment, the C-counter 204 counts up or down on every ClkRO clock cycle. In one embodiment, the C-counter 204 is reset to count from a known point when the SET signal is generated by the first logic unit 101. The C-counter 204 can be implemented using any known counter architectures.

In one embodiment, the output 'C' of the C-counter 204 is compared with a (K−2)/2 value by a comparator 206, where 'K' is an integer greater than 2 and may be set by software or hardware, and where (K−2)/2 value represents the halfway mark of the period of the input clock signal clkIN In this embodiment, the output cmp1 of the comparator 206 triggers, i.e. the output cmp1 signal transitions from logical high to low or low to high, when the count value 'C' is equal to (K−2)/2 value. The output cmp1 of the comparator 206 is then used for generating the RESET signal for the output sequential logic unit 103 to generate the falling edge of the output clock signal clkOUT, according to one embodiment of the invention. In one embodiment, the output cmp1 from the comparator 206 is synchronized by a flip-flop 209 to generate the RESET signal.

In one embodiment, for an input clock signal clkIN of 24 MHz and with a ring oscillator clock clkRO of 4 GHz, the value of 'K' is between 166 and 167 and the granularity of all edge signal placements is 250 ps out of 41.667 ns or 6000 ppm.

In one embodiment, the (K−2)/2 value is generated by a second counter 205 (also called the K-counter 205). In one embodiment, the K-counter 205 receives a clock signal which is a logical AND operation of the SET signal and the ClkRO signal. In one embodiment, the AND operation is performed by a AND gate 211 which may be implemented as a NAND gate. In one embodiment, the K-counter 205 is counted up or down by the up/dn signal until the value K−2 of the counter is equal to the value 'C' from the C-counter 204. In one embodiment, a second comparator 207 is used to compare the output 'C' of the C-counter 204 and the output of the K-counter 205 to generate an output cmp2. In one embodiment, the output cmp2 is used as the up/dn signal for the K-counter 205. In other embodiments, a flip-flop 210 is used to synchronize the output cmp2 to generate the up/dn signal for the K-counter 205.

In the embodiments discussed herein, the comparators 206 and 207 may be implemented as binary comparators. Other architectures of the comparators may be used without changing the essence of the embodiments of the invention. In one embodiment, the length of 'C' and 'K' counters, in terms of number of bits, is sufficient to contain a ratio of 24 MHz period of input clock clkIN to period of ClkRO from the ring oscillator 104.

In one embodiment, the up/dn signal of the K-counter 205 causes the K-counter 205 to count up when the value of 'C' (also called first count) is greater or equal to K−2 value. In one embodiment, additional logic is added to handle any overflow of the K-counter 205. For example, the up/dn signal of the K-counter 205 causes the K-counter 205 to count up when the value of 'C' is greater or equal to K−2 value and when K−2 value is less than $2N^2$, where N is an integer greater than 1 and represents the size of the K-counter 205.

In one embodiment, the up/dn signal of the K-counter 205 causes the K-counter 205 to count down when the value of 'C' is less than K−2 value. In one embodiment, additional logic is added to handle any underflow of the K-counter 205. For example, the up/dn signal of the K-counter 205 causes the K-counter 205 to count down when the value of 'C' is less than K−2 value and when K−2 is greater than zero. If none of the two conditions for counting up and counting down are met then the K-counter 205 neither counts up nor down, according to one embodiment of the invention.

In one embodiment, the output K−2 of the K-counter 205 is divided by two by a divide-by-two logic unit 208 to generate (K−2)/2 value to be compared by the comparator 206 as discussed herein. In one embodiment, the divide-by-two logic unit 208 is implemented to perform a logical shift operation that results in a divide-by-two operation. In one embodiment, the divide-by-two logic unit 208 is implemented as a flip-flop (not shown) in which the output of the flip-flop is inverted and used as a data input signal for the flip-flop while K−2 output from the K-counter 205 is used as the clock input signal for the flip-flop. In other embodiments, other forms of divide-by-two architectures may be used without changing the essence of the embodiments of the invention.

Figure 3:
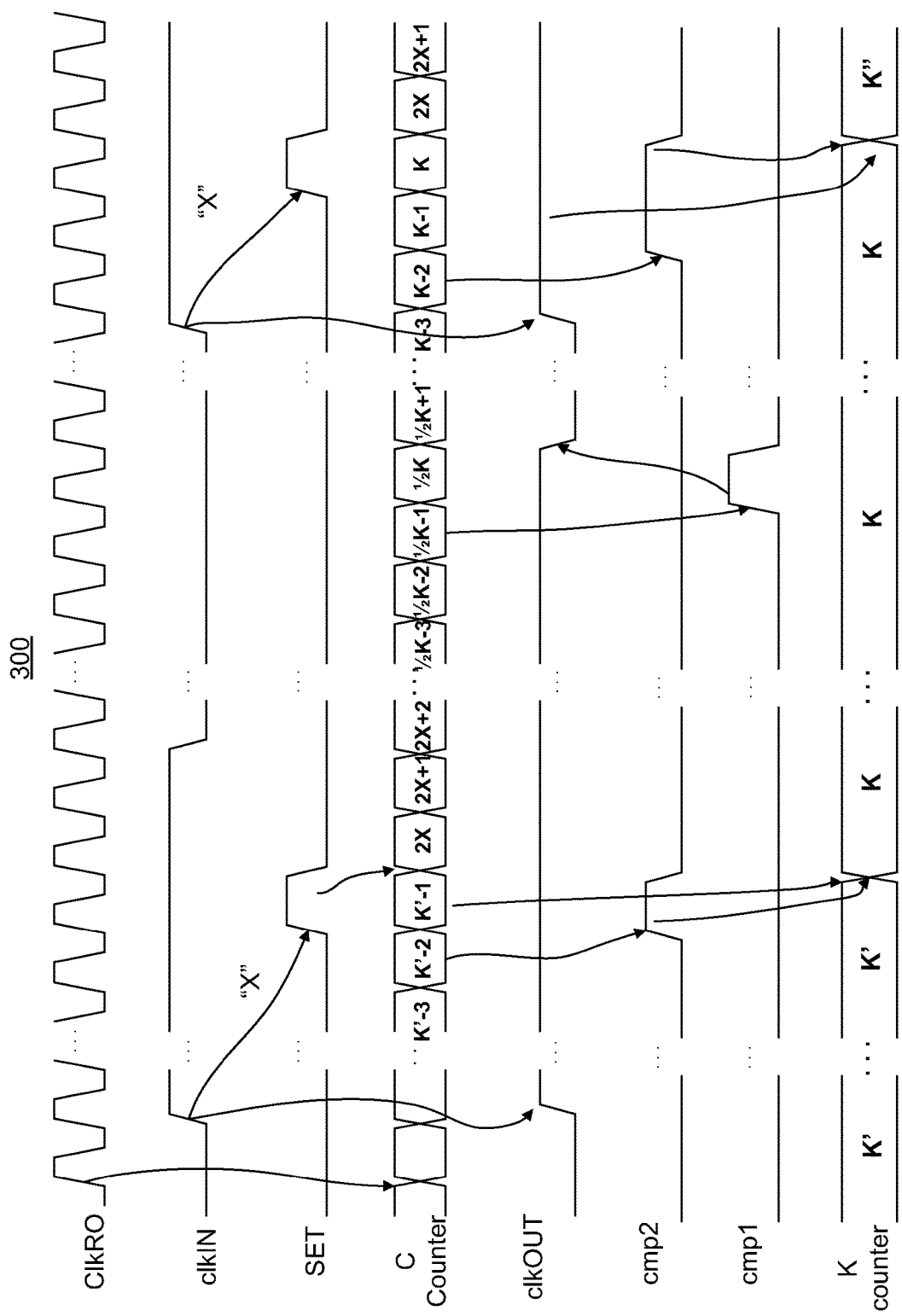
FIG. 3 is timing diagram of the clock re-synthesizer of FIG. 2, according to one embodiment of the invention.

FIG. 3 is timing diagram 300 of the clock re-synthesizer 200 of FIG. 2, according to one embodiment of the invention. The first signal from the top is the ClkRO signal which is a periodic clock signal generated by the ring oscillator 104, according to one embodiment of the invention. The frequency of the ClkRO signal by can be adjusted by adjusting the delay of the delay elements that form the ring oscillator 104. The next signal from the top is the clkIN signal which is the input signal with non-50% duty cycle. In one embodiment, the first logic unit 101 uses the rising edge of the clkIN signal to generate the SET signal for setting the output sequential logic unit 103. In the timing diagram 300, the SET signal is a synchronous SET signal.

Following the Edge signal is the 'C' signal which is the output of the C-counter 204. The C-counter 204 counts up on every rising edge of the ClkRO signal, according to one embodiment of the invention. Following the 'C' signal is the output clock signal clkOUT which is has a near 50% duty cycle. The rising edge of the clkOUT signal is generated by setting the output sequential logic unit 103a by means of the SET signal which indicates the rising edge of the input clock signal clkIN, according to one embodiment of the invention. The falling edge of the output clock signal clkOUT is generated by resetting the output sequential logic unit 103a by means of the RESET signal which is generated by the second logic unit 102, according to one embodiment of the invention.

Following the clkOUT signal are the outputs cmp2 and cmp1 of the comparators 207 and 206 respectively. The signal cmp1 is asserted when the value of the C-counter, i.e. 'C' value, equals (K−2)/2, according to one embodiment of the invention. In such an embodiment, the signal cmp1 is held high for at least one clock cycle or phase of the ring oscillator clock ClkRO. The cmp1 signal is then used to generate the RESET signal for resetting the output sequential logic unit 103a to generate the falling edge of the clkOUT signal.

The signal cmp2 is asserted when the K-counter 205 and the C-counter 204 have the same value which is equal to K−2 value. In such an embodiment, the signal cmp2 is held high for at least one clock cycle or phase of the ring oscillator clock ClkRO which is enough to cause the K-counter 205 to either count up or down. Following the cmp2 and cmp1 signals is the K-counter signal which is the output of the K-counter 205.

Figure 4:
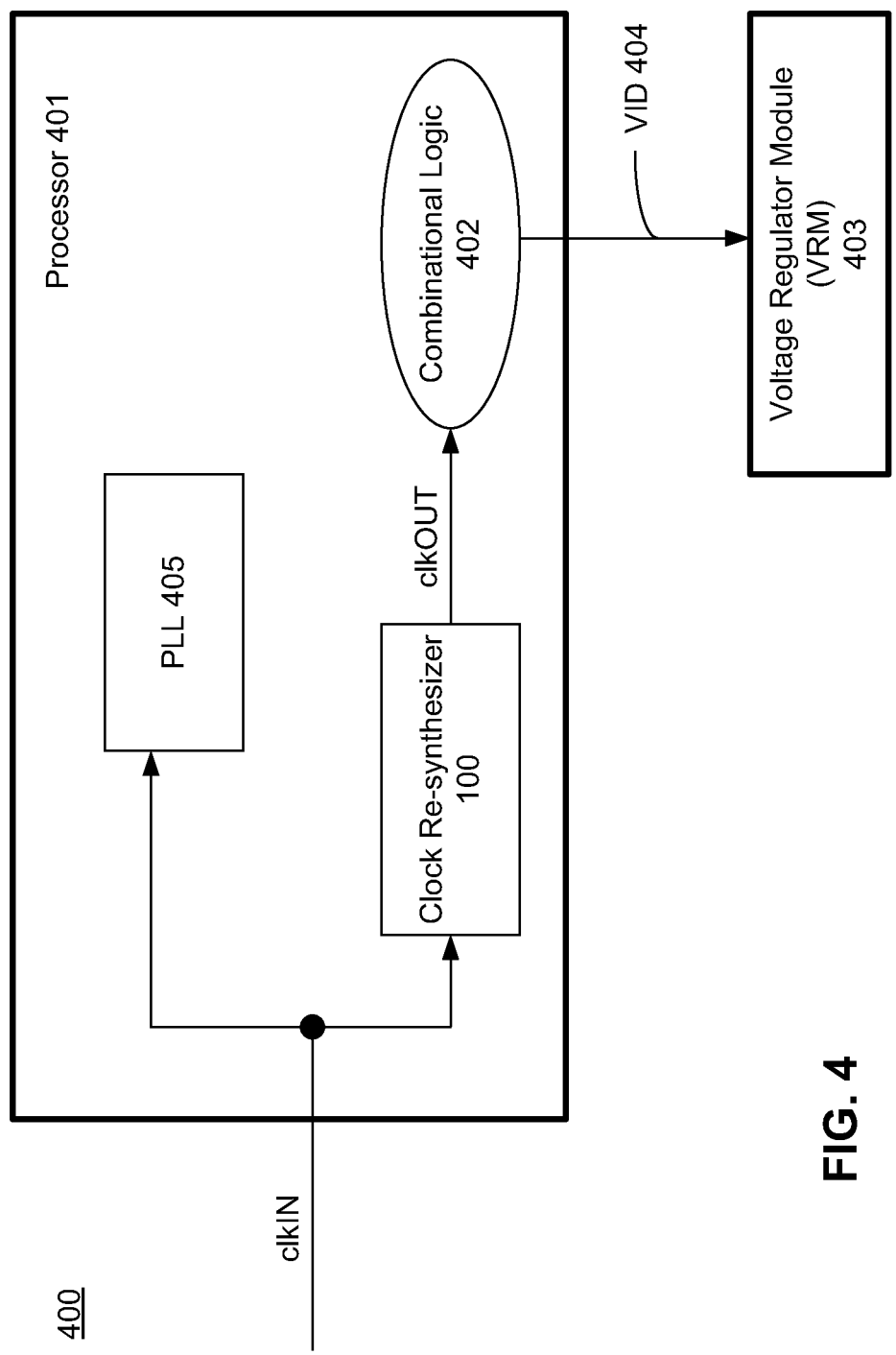
FIG. 4 is a processor comprising the clock re-synthesizer, according to one embodiment of the invention.

FIG. 4 is system diagram 400 comprising a processor 401 which includes the clock re-synthesizer 100, according to one embodiment of the invention. In one embodiment, the input clock signal clkIN is received by a phased locked loop (PLL) 405 that generates an output clock signal which is phase locked to the input clock signal clkIN In one embodiment, the PLL 405 is a display PLL used for providing a phased locked clock to a display unit (not shown).

In one embodiment, the input clock signal clkIN is received by the clock re-synthesizer 100 in the processor 401. The clock re-synthesizer 100 converts the non-50% input clock signal clkIN to a near 50% clock output signal clkOUT which is then used to generate voltage identity (VID) bits 404. In one embodiment, the VID bits 404 are used to determine a power supply level for one or more other processors (not shown). In one embodiment, the combinational logic 402 expects a near 50% duty cycle input clock signal to correctly generate the VID bits 404 for a voltage regulator module (VRM) 403. The output of the VRM 403 is used to supply a regulated power supply to one or more of the other processors.

Figure 5:
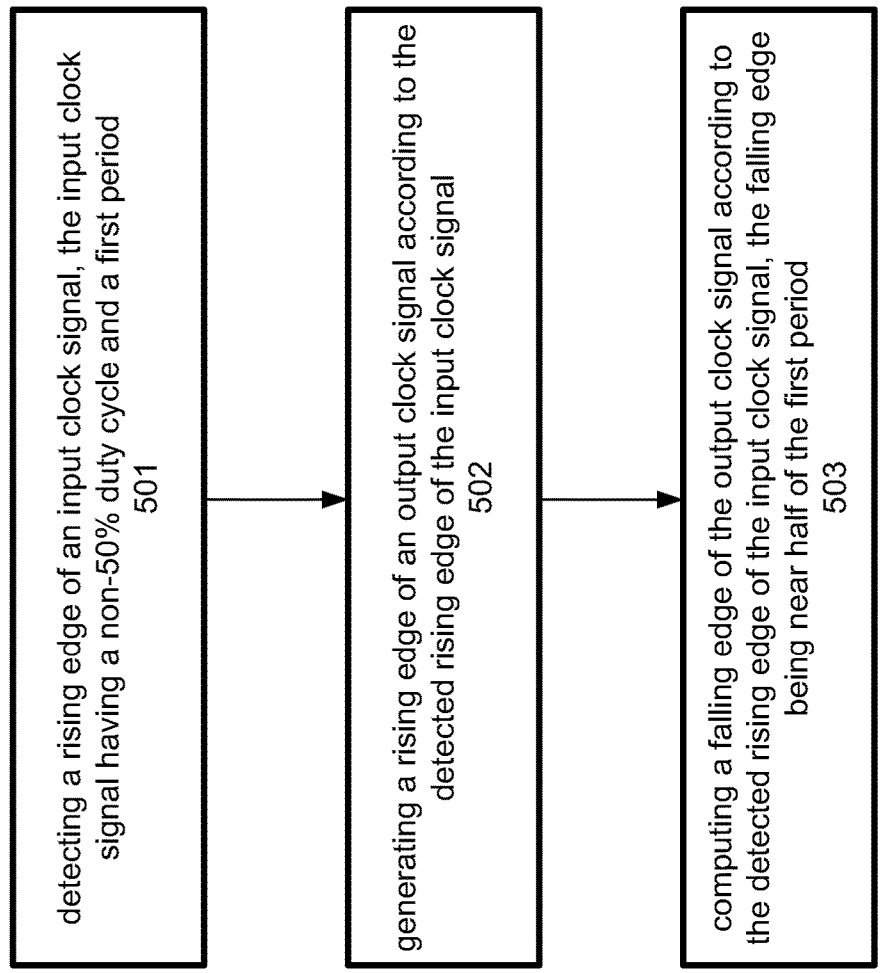
FIG. 5 is a method flowchart for re-synthesizing a clock signal, according to one embodiment of the invention.

FIG. 5 is a method flowchart re-synthesizing a clock signal, according to one embodiment of the invention. Although the blocks in the flowchart 500 are shown in a particular order, the order of the actions can be modified. Thus, the illustrated embodiments can be performed in a different order, and some actions/blocks may be performed in parallel. Additionally, one or more actions/blocks can be omitted in various embodiments of re-synthesizing a clock signal. The flowchart of FIG. 5 is illustrated with reference to the embodiments of FIGS. 1-4.

At block 501, the first logic unit 101 detects a rising edge of the input clock signal clkIN, the input clock signal clkIN having a non-50% duty cycle and a first period. At block 502, the output sequential logic unit 103 generates a rising edge of an output clock signal clkOUT according to the detected rising edge (e.g., the SET signal) of the input clock signal clkIN, wherein generating the rising edge of the output clock signal comprises setting the flip-flop 103a in response to the rising edge of the input clock signal. At block 503, the second logic unit 102 computes a falling edge of the output clock signal clkOUT according to the detected rising edge (SET signal) of the input clock signal clkIN, the falling edge being near half of the first period.

In one embodiment, the method further comprises setting, in response to the SET signal, the flip-flop 103a according to the detected rising edge of the input clock signal. In one embodiment, the method further comprises resetting, in response to a RESET signal generated from the second logic unit 102, the flip-flop 103a for generating the falling edge of the output clock signal clkOUT. In one embodiment, the method further comprises generating sampling clock signals (e.g., ClkRO) for the output sequential logic unit 103, wherein the output sequential logic unit is operable to generate the output clock signal ClkOUT. In one embodiment, the method further comprises generating the VID signal 404 by applying the output clock signal clkOUT as a sampling clock signal; and generating a regulated power supply by the VRM 403 according to the VID signal 404.

Figure 6:
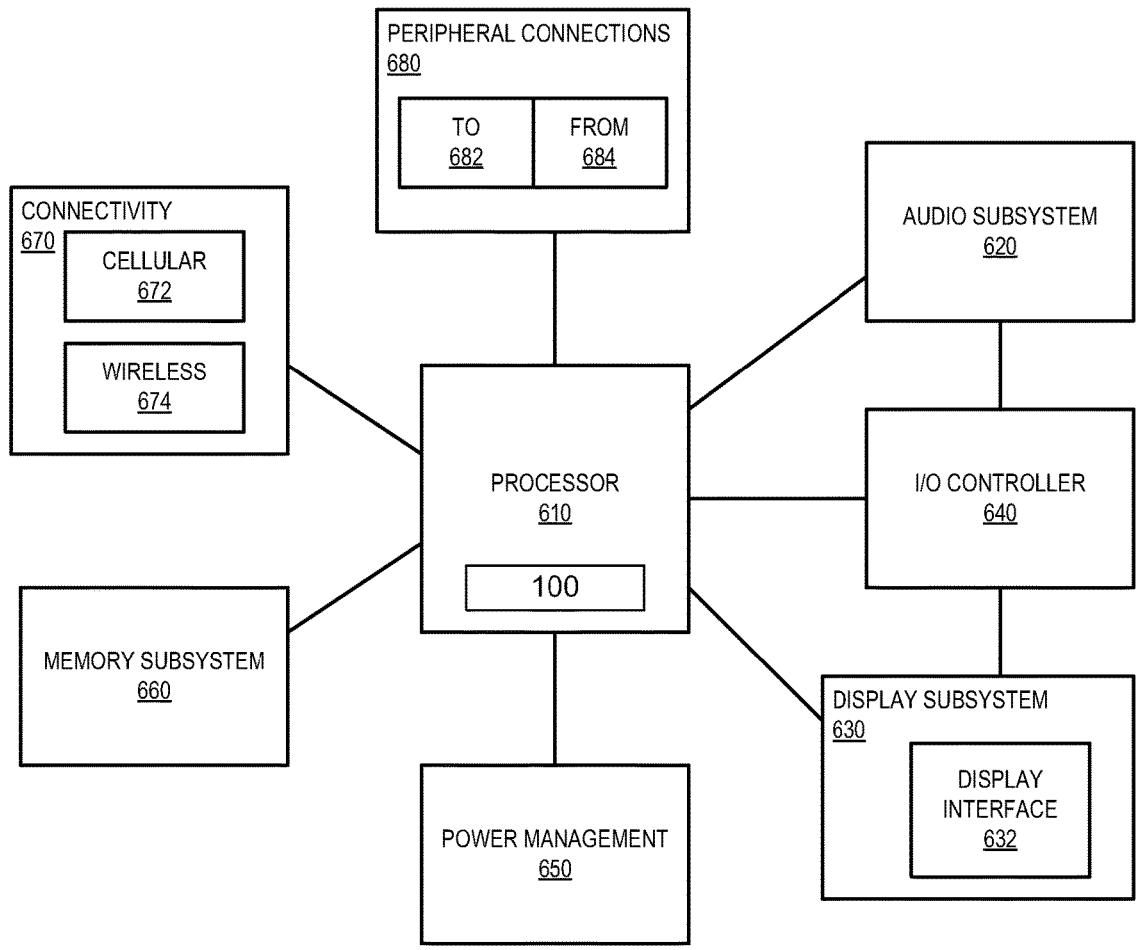
FIG. 6 is a system-level diagram of a smart device comprising a processor with the clock re-synthesizer, according to one embodiment of the invention.

FIG. 6 is a system-level diagram of a smart device comprising a processor with the clock re-synthesizer 100, according to one embodiment of the invention. FIG. 6 also illustrates a block diagram of an embodiment of a mobile device in which flat surface interface connectors could be used. Computing device 600 represents a mobile computing device, such as a computing tablet, a mobile phone or smart-phone, a wireless-enabled e-reader, or other wireless mobile device. It will be understood that certain of the components are shown generally, and not all components of such a device are shown in device 600.

Device 600 includes processor 610, which performs the primary processing operations of device 600. In one embodiment, the processor 610 includes the clock re-synthesizer 100 as discussed with reference to FIGS. 1-5 and FIG. 7.

Referring back to FIG. 6, the processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, the I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 includes memory devices for storing information in device 600. Memory can include non-volatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

Elements of embodiments are also provided as a machine-readable medium (e.g., memory 660) for storing the computer-executable instructions (e.g., instructions to implement the flowchart of FIG. 5 and any other processes discussed above). The machine-readable medium (e.g., memory 660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description.

For example, design for test (DFT) features may be added to the clock re-synthesizer 100 to provide debugging capability to the embodiment of 100. In one embodiment, modes such as "load," "hold," and "track" may be added to operate the clock re-synthesizer 100.

In one embodiment, during "load" mode, the K−2 value is loaded from an external source on every ClkRO cycle and the comparator result cmp2 from the comparator 207 is used to force a reset on the C-counter 204 to synchronously cycle the counter 204 from zero through K−1. In such an embodiment, the output clock signal clkOUT asserts synchronously on the same cycle as the cycle when 'C' value becomes zero. In this embodiment, the output clock signal clkOUT de-asserts when 'C' equals K/2 using the comparator 206.

In one embodiment, during the "hold" mode the K−2 word remains static. In such an embodiment, the "hold" mode is identical to the "track" mode except that the K−2 word remains static.

Figure 7:
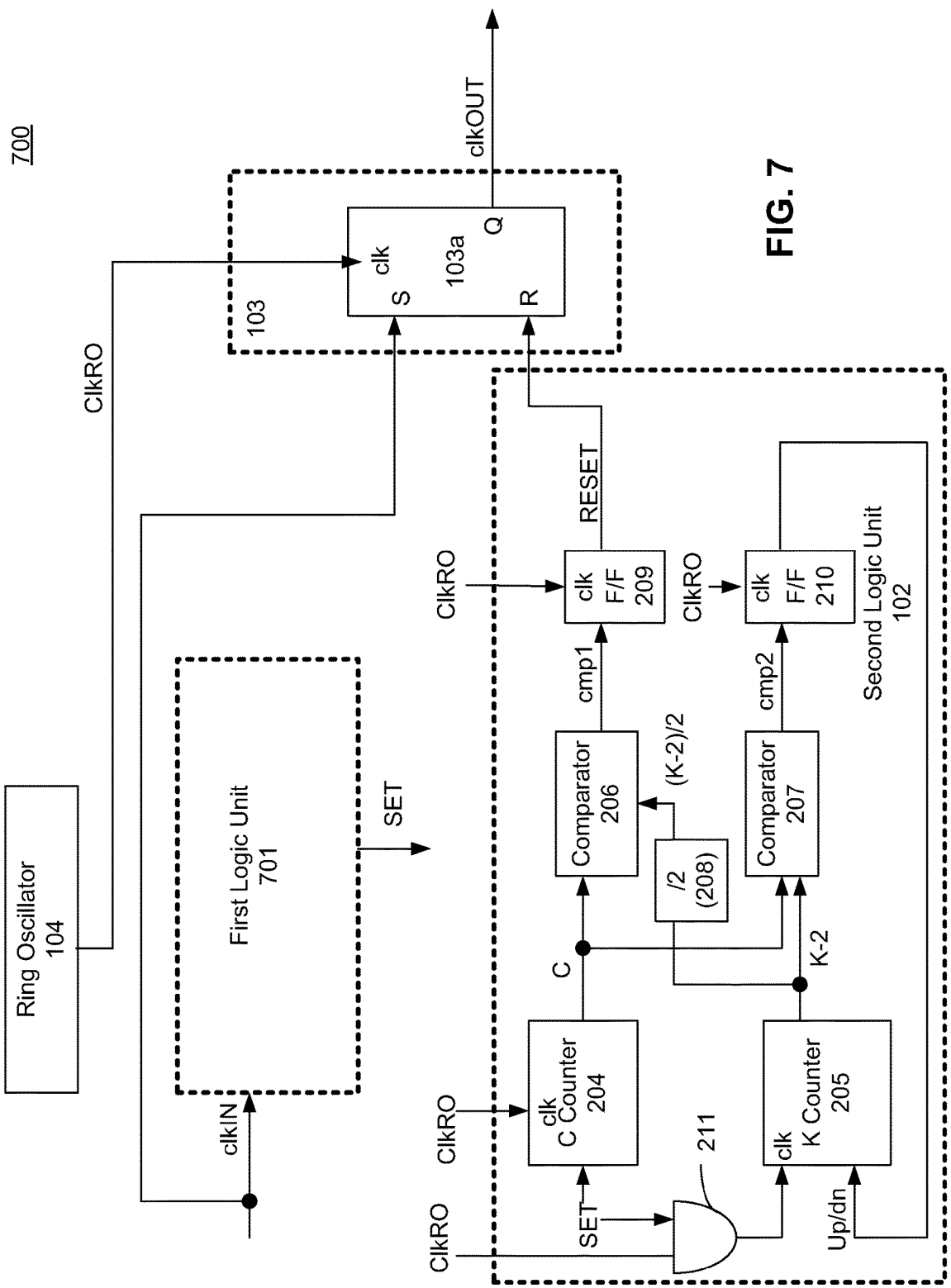
FIG. 7 is a logical block diagram of the clock re-synthesizer, according to another embodiment of the invention.

In one embodiment, during the "track" mode, the value of 'C' from the C-counter 204 is reset by the edge detector of the first logic unit 101 instead of the comparators 206 and 207. In such an embodiment, the C-counter 204 reset causes the clkOUT signal to assert FIG. 7 is a logical block diagram of a clock re-synthesizer 700, according to another embodiment of the invention. So as not to obscure the embodiments of the invention, the only the modifications between the clock re-synthesizer 200 and the clock re-synthesizer 700 are described.

In one embodiment, the first logic unit 701 is a meta-stable resistant edge detector like the first logic unit 101, but its output SET is not used to set the flip-flop 103a. In this embodiment, the rising edge of the output clock signal clkOUT is generated by the rising edge of the input clock signal clkIN directly by setting the set input of the flip-flop 103a. In one embodiment, the output SET from the first logic unit 701 is used to reset/adjust the C and K counters, 204 and 205 respectively as discussed herein. In one embodiment, the added latency of traversing the meta-stable resistant edge detector of the first logic unit 701 causes the C counter's 204 reset state (2×) to be greater than zero. The falling edge of the output clock signal clkOUT is generated by the same hardware and method as discussed herein.

The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first logic unit to detect a rising edge of an input clock signal having a first period, wherein the first logic unit is configured to generate a set signal based on the detected rising edge of the input clock signal;
a second logic unit coupled the first logic unit, the second logic unit comprising a first counter to count on a first sampling clock signal in response to the set signal and a first comparator coupled to the first counter to compare a first count value from the first counter with a predetermined value representing a halfway mark of the first period of the input clock signal, wherein the first comparator is configured to generate a first compare signal when the first count value reaches the predetermined value, wherein the first compare signal is used to generate a reset signal; and
an output sequential unit coupled to the second logic unit to receive the reset signal and to output an output clock signal, wherein the reset signal is used for generating a falling edge of the output clock signal, the falling edge of the output clock signal being near half of the first period of the input clock signal.

2. The apparatus of claim 1 further comprises:
a logic unit to generate a voltage supply identity (VID) signal by applying the output clock signal as a second sampling clock signal; and
a voltage regulator module to generate a regulated power supply according to the VID signal.

3. The apparatus of claim 1 further comprises:
a ring oscillator to provide the first sampling clock signal for the first and second logic units and the output sequential logic unit, wherein the output sequential logic unit is operable to be:
set in response to the set signal; and
reset in response to the reset set signal.

4. The apparatus of claim 1, wherein the first logic unit comprises:
a meta-stable resistant sequential logic unit to receive the input clock signal;
a sequential logic unit to receive an output of the meta-stable resistant sequential logic unit; and
a first logic gate to receive the output of the meta-stable resistant sequential logic and to receive an output of the sequential logic unit, the first logic gate to execute an AND operation to generate a set signal to set the output sequential logic unit.

5. The apparatus of claim 1, wherein the halfway mark is represented by a (K−2)/2 value, wherein the reset signal is used for resetting the output sequential logic unit, and wherein 'K' is an integer greater than 2.

6. The apparatus of claim 1, wherein the second logic unit comprises:
a second logic gate to execute an AND operation on the set signal and the first sampling clock signal;
a second counter to count in response to the output of the second logic gate, the second counter to generate a K−2 value;
a divide-by-two unit to divide the K−2 value by 2 to generate a (K−2)/2 value; and
a second comparator to compare the first count value and the K−2 value, and to generate a second compare signal, the second compare signal to cause the second counter to count up or down.

7. The apparatus of claim 6, wherein the second logic unit comprises:
a third sequential logic unit to sample the first compare signal by applying the first sampling clock signal, the output of the third sequential logic unit to generate the reset signal for resetting the output sequential logic unit; and
a fourth sequential logic unit to sample the second compare signal by applying the first sampling clock signal, the output of the third sequential logic unit for causing the second counter to count up or down.

8. The apparatus of claim 1 wherein the output sequential logic unit is operable to set itself in response to the rising edge of the input clock signal.

9. A method comprising:
   detecting a rising edge of an input clock signal having a first period;
   generating a set signal according to the detected rising edge of the input clock signal;
   counting on a first sampling clock signal in response to the set signal;
   comparing a first count value on the first sampling clock signal with a predetermined value that represents a halfway mark of the first period of the input clock signal;
   generating a first compare signal when the first count value on the first sampling clock signal reaches the predetermined value;
   generating a reset signal based on the first compare signal; and
   generating a falling edge of an output clock signal according to the reset signal, the falling edge being near half of the first period of the input clock signal.

10. The method of claim 9, wherein the output clock signal has a duty cycle closer to being a 50% duty cycle than the duty cycle of the input clock signal.

11. The method of claim 9, further comprising setting an output sequential logic unit in response to the set signal.

12. The method of claim 11
   the output sequential logic unit is set according to the detected rising edge of the input clock signal.

13. The method of claim 11, further comprising
   resetting, in response to the reset signal, the output sequential logic unit for generating the falling edge of the output clock signal.

14. The method of claim 9, further comprising
   generating the first sampling clock signal for an output sequential logic unit, wherein the output sequential logic unit is to generate the output clock signal.

15. The method of claim 9, further comprising
   generating a voltage supply identity (VID) signal by applying the output clock signal as a second sampling clock signal.

16. A system comprising:
   a wireless connectivity;
   a clock re-synthesizer, communicatively coupled to the wireless connectivity, comprising:
      a first logic unit to detect a rising edge of an input clock signal having a first period, wherein the first logic unit is configured to generate a set signal based on the detected rising edge of the input clock signal; and
      a second logic unit coupled the first logic unit, the second logic unit comprising a first counter to count on a first sampling clock signal in response to the set signal, and a first comparator coupled to the first counter to compare a first count value from the first counter with a predetermined value representing a halfway mark of the first period of the input clock signal, wherein the first comparator is configured to generate a first compare signal when the first count value reaches the predetermined value, wherein the first compare signal is used to generate a reset signal;
      an output sequential logic unit coupled to the second logic unit to receive the reset signal and to output an output clock signal, wherein the reset signal is used for generating a falling edge of the output clock signal, the falling edge of the output clock signal being near half of the first period of the input clock signal; and
   a display unit.

17. The system of claim 16 further comprising
   a logic unit to generate a voltage supply identity (VID) signal by applying the output clock signal as a second sampling clock signal; and
   a voltage regulator module to generate a regulated power supply according to the VID signal.

18. The system of claim 16, wherein the first logic unit comprises:
   a meta-stable resistant sequential logic unit to receive the input clock signal;
   a sequential logic unit to receive an output of the meta-stable resistant sequential logic unit; and
   a first logic gate to receive the output of the meta-stable resistant sequential logic and to receive an output of the sequential logic unit, the first logic gate to execute an AND operation to generate a set signal to set the output sequential logic unit.

19. The system of claim 16, wherein the second logic unit comprises: a second counter coupled to the first counter, wherein the first counter is configured to count from a pre-determined count setting to the first count value, wherein the predetermined value is a (K−2)/2 value associated with the second counter.

20. The system of claim 16 further comprising
   a ring oscillator to provide the first sampling clock signal for the first and second logic units and the output sequential logic unit.

* * * * *